(12) United States Patent
Dernier et al.

(10) Patent No.: US 9,265,180 B2
(45) Date of Patent: Feb. 16, 2016

(54) SET TOP BOX HAVING HEAT SINK PRESSURE APPLYING MEANS

(71) Applicant: THOMSON LICENSING, Issy de Moulineaux (FR)

(72) Inventors: William Phillip Dernier, Indianapolis, IN (US); Kevin Michael Williams, Indianapolis, IN (US)

(73) Assignee: THOMSON LICENSING, Issy les Moulineaux (FR)

( * ) Notice: Subject to any disclaimer, the term of this patent is extended or adjusted under 35 U.S.C. 154(b) by 0 days.

(21) Appl. No.: 14/424,288

(22) PCT Filed: Jul. 23, 2013

(86) PCT No.: PCT/US2013/051624
§ 371 (c)(1),
(2) Date: Feb. 26, 2015

(87) PCT Pub. No.: WO2014/039173
PCT Pub. Date: Mar. 13, 2014

(65) Prior Publication Data
US 2015/0230363 A1    Aug. 13, 2015

Related U.S. Application Data

(60) Provisional application No. 61/698,077, filed on Sep. 7, 2012.

(51) Int. Cl.
*H05K 7/20* (2006.01)
*H05K 1/02* (2006.01)

(52) U.S. Cl.
CPC ............. *H05K 7/2049* (2013.01); *H05K 1/021* (2013.01)

(58) Field of Classification Search
CPC .............................. H05K 5/00; H05K 7/2049
See application file for complete search history.

(56) References Cited

U.S. PATENT DOCUMENTS

| | | | |
|---|---|---|---|
| 6,185,100 B1* | 2/2001 | Bentz | H05K 7/2049 165/185 |
| 6,226,184 B1 | 5/2001 | Stolz et al. | |
| 6,673,998 B1* | 1/2004 | Wu | H05K 7/2049 174/383 |
| 2006/0176672 A1* | 8/2006 | Kamemoto | H05K 7/2049 361/714 |
| 2006/0187643 A1* | 8/2006 | Tsurufusa | H05K 7/2049 361/704 |
| 2006/0187645 A1* | 8/2006 | Numata | H05K 7/2049 361/704 |
| 2010/0027220 A1* | 2/2010 | Hughes | H05K 7/20445 361/702 |
| 2010/0097768 A1* | 4/2010 | Ishii | H01L 23/4006 361/719 |
| 2010/0263851 A1 | 10/2010 | Yasui | |
| 2011/0141701 A1* | 6/2011 | Uejima | H01L 23/36 361/722 |

(Continued)

FOREIGN PATENT DOCUMENTS

| | | |
|---|---|---|
| DE | 202008003872 | 6/2008 |
| EP | 2104410 | 12/2012 |
| WO | WO2013078260 | 5/2013 |

*Primary Examiner* — Hung V Ngo
(74) *Attorney, Agent, or Firm* — Robert D. Shedd; Catherine A. Cooper (57) ABSTRACT

Described is an electronic device, including a top frame, a bottom frame, a circuit board mounted above the bottom frame, a thermal pad mounted on the circuit board, a heat sink associated with the thermal pad and a plurality of springs for providing a biasing force that retains the heat sink against the thermal pad, the heat sink including a planar portion surrounding a central depression, wherein the plurality of springs secure the thermal pad of the circuit board between the central depression portion of the heat sink and the circuit board.

5 Claims, 11 Drawing Sheets

(56) References Cited

U.S. PATENT DOCUMENTS

| | | | |
|---|---|---|---|
| 2013/0077282 A1* | 3/2013 | Malek | H05K 9/03 361/818 |
| 2013/0235528 A1* | 9/2013 | Lee | H05K 9/0032 361/704 |
| 2013/0258601 A1* | 10/2013 | Qin | H05K 7/2049 361/714 |
| 2014/0321064 A1* | 10/2014 | Bose | H01L 23/4093 361/720 |
| 2014/0340850 A1* | 11/2014 | Fan | H05K 7/20445 361/720 |
| 2015/0264835 A1* | 9/2015 | Kohn | H05K 7/20154 361/697 |

\* cited by examiner

DEVICE REQUIRING HEAT SINK
This can be the thermal pad on the heat generating device or can be the heat generating device

DEVICE WITH HEAT SINK

SET TOP BOX HAVING HEAT SINK PRESSURE APPLYING MEANS

This application claims the benefit, under 35U.S.C. §365 of International Application PCT/US13/51624, filed 23 Jul. 2013, which was published in accordance with PCT Article 21(2) on 13 Mar. 2014 in English and which claims the benefit of U.S. provisional patent application No. 61/698,077, filed 7 Sep. 2012.

FIELD OF THE INVENTION

The invention relates to a set top box, and more particularly, a set top box having springs for retaining a heat sink.

BACKGROUND OF THE INVENTION

Thermal management remains a significant challenge in set top boxes. With the introduction of more components such as smart card readers and increased functionalities, which tend to produce more heat, the need for an improved thermal management system exists.

An additional complication in set top boxes is the need to reduce the size of set top boxes due to consumer preference. This trend for compactness also makes thermal management a challenge, because this greater compactness with an increase in the number of internal components generally results in a concentration of heat.

Proper thermal contact between a thermal pad on a circuit board and a heat sink improves heat dissipation from the circuit board. Existing means for securing the heat sink against the thermal pad result in undesirable rattling of the heat sink against the thermal pad and set top box. Additionally, existing securing means do not provide sufficient contact of the thermal pad with the heat sink.

Therefore, a need exists for a retainer to secure a heat sink in proper contact with the thermal pad and stabilize the heat sink to reduce rattling.

FIGS. 1-9 illustrate a set top box that employs one means of ensure thermal contact and heat sink stabilization. The shortcomings of the system in FIGS. 1-9 is that it is preferable to have long grooves formed in the heat sink and it may be necessary for some additional means to be added to the base to secure the hold down.

However, the disclosed invention can be utilized with all of the embodiments or some of the embodiments shown and described in FIGS. 1-9. It can be used with the features used without the hold down and with the additional means added to the base or it can be used with the hold down and without the additional means.

Figure 1:
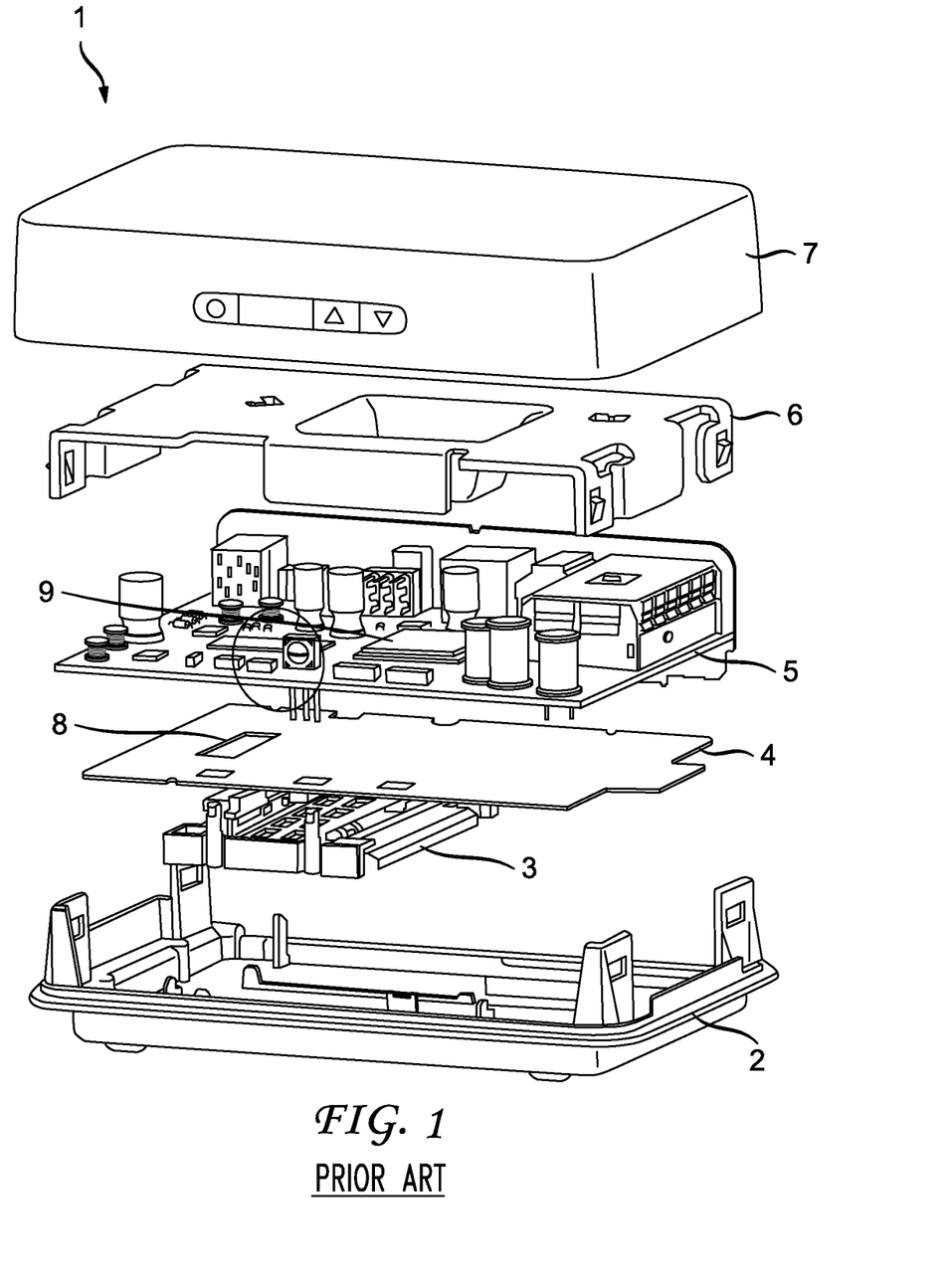
FIG. 1 is an exploded view of a known set top box.

As illustrated in FIG. 1, a circuit board 5 is housed within a top cover 7 of a set top box 1. A thermal barrier 4 is positioned between the circuit board 5 and a bottom frame 2. A smart card reader 3 is connected to the circuit board 5 through an aperture 8 in the thermal barrier 4. The set top box 1 has internal components including the smart card reader 3, the thermal barrier 4, the circuit board 5, and a heat sink 6 that contacts the circuit board 5 and is positioned between the bottom frame 2 and the top cover 7. The thermal barrier 4 includes a thermal insulating material that preferably has substantially the same profile as the circuit board 5 or a profile that is at least 80% of the area profile of the circuit board 5. The thermal barrier 4 keeps the smart card reader 3 and other components under the circuit board 5 from overheating, in part, by preventing heat from transferring from the circuit board 5 and the components thereon.

Figure 3:
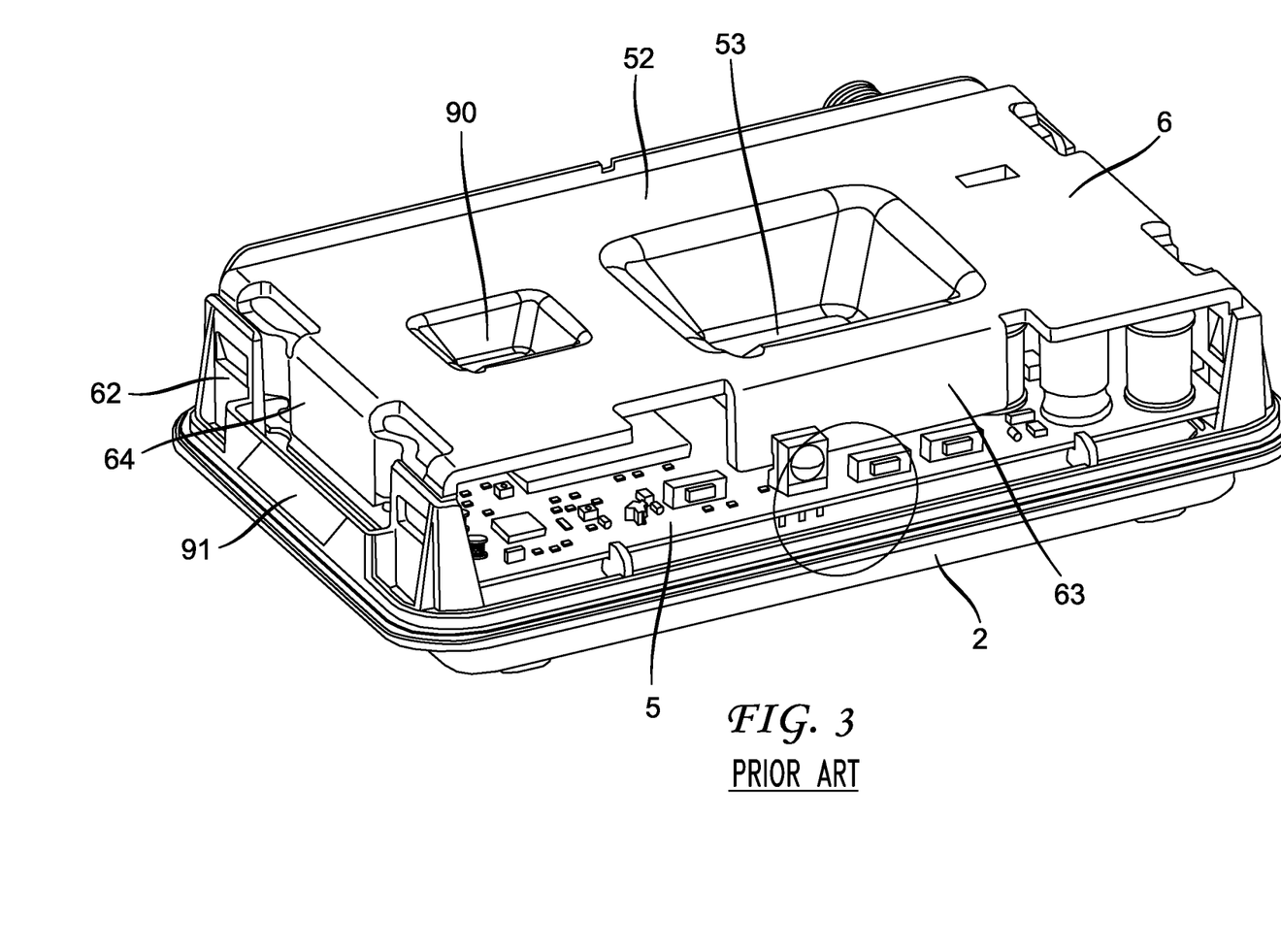
FIG. 3 illustrates the interior components of the set top box of FIGS. 1-2 with the heat sink attached to the bottom frame.

The heat sink 6 is a heat dissipating feature that removes heat from the circuit board 5. The heat sink 6 has a top plan profile that completely covers the circuit board 5 or substantially covers the circuit board 5 such that at least 80% of the circuit board 5 is covered. The heat sink 6 may include a thermal pad 9. Referring now to FIG. 3, the heat sink 6 is a contoured plate that has a generally planar periphery 52 and a recessed feature such as a central depression 53 into a plane of the planar periphery 52, wherein the planar periphery 52 preferably surrounds the central depression 53. The central depression 53 has side walls extending from the planar periphery 52 and forming an obtuse angle therewith. The central depression 53 has a flat bottom that is designed to contact the circuit board 5, the heat generating components on the circuit board 5, and/or the thermal pad 9.

Figure 2:
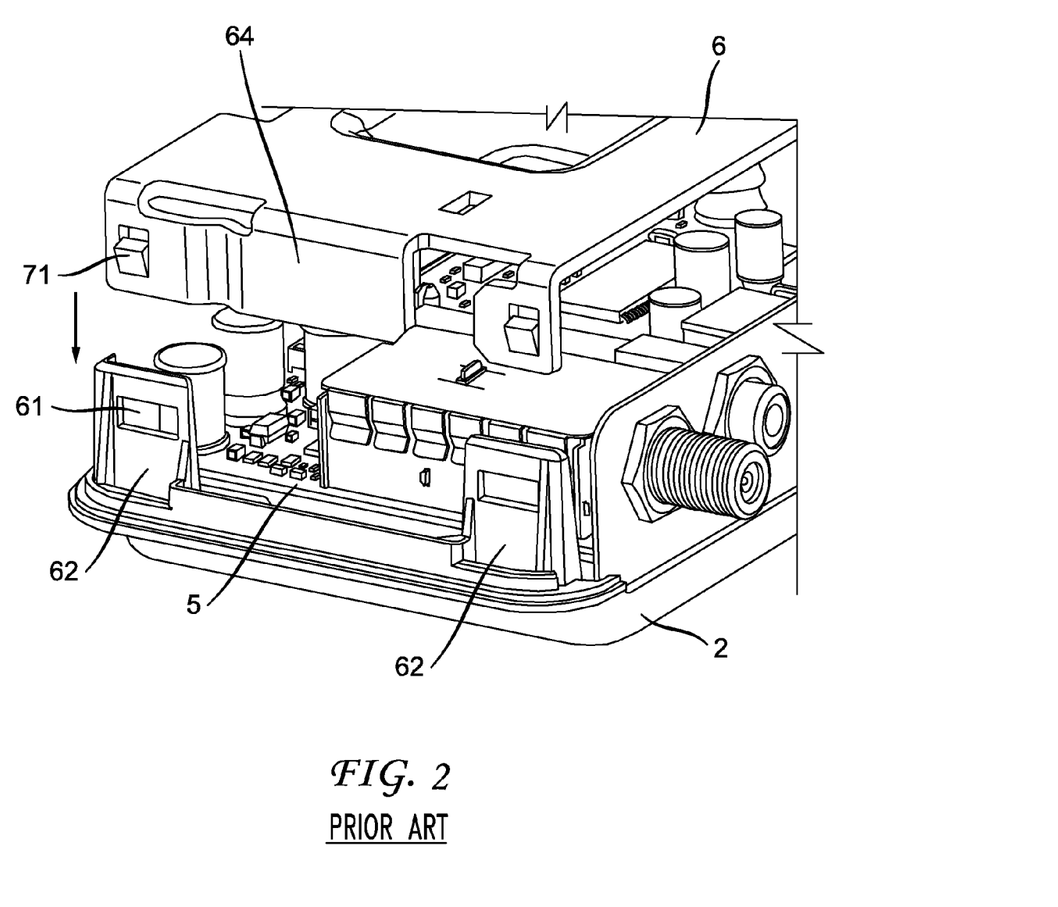
FIG. 2 is an enlarged view showing the heat sink of FIG. 1 prior to attachment with the bottom frame, wherein the springs according to the invention, which are not shown can be incorporated.

Referring now to FIGS. 2 and 3, the heat sink 6 has vertical extensions 64 at the outer edges of the planar periphery 52 that are perpendicular to the planar periphery 52 and that extend over the circuit board 5 and contact the bottom frame 2 or vertically extending portions 62 of the bottom frame 2. The heat sink 6 attaches to the bottom frame 2 through slots and clips formed on these elements. The vertically extending portions 62 extend from the bottom frame 2 and have receiving slots 61 that are designed to receive clips 71 formed on the vertical extensions 64 of the heat sink 6. The vertically extending portions 62 may be plastic components, and as such, allow the heat sink clips 71 to elastically snap into the slots 61, thereby securing the heat sink 6 to the bottom frame 2. As illustrated in FIG. 2, the arrow indicates how the heat sink clips 71 are pressed downward into the bottom frame slots 61.

FIG. 3 is a perspective view of interior components of the set top box 1. The set top box 1 may include a second central depression 90 that contacts a secondary thermal pad 99 (not shown) associated with the smart card reader 3. The bottom frame 2 may include a smart card access slot 91 below the circuit board 5 and one of the vertical extensions 64 of the heat sink 6. The slot 91 may also be between the vertically extending portions 62 of the bottom frame 2. The second central depression 90 thermally communicates with the smart card reader 3 through an aperture 8 in the circuit board 5 or the secondary thermal pad 99 through the circuit board 5.

Figure 4:
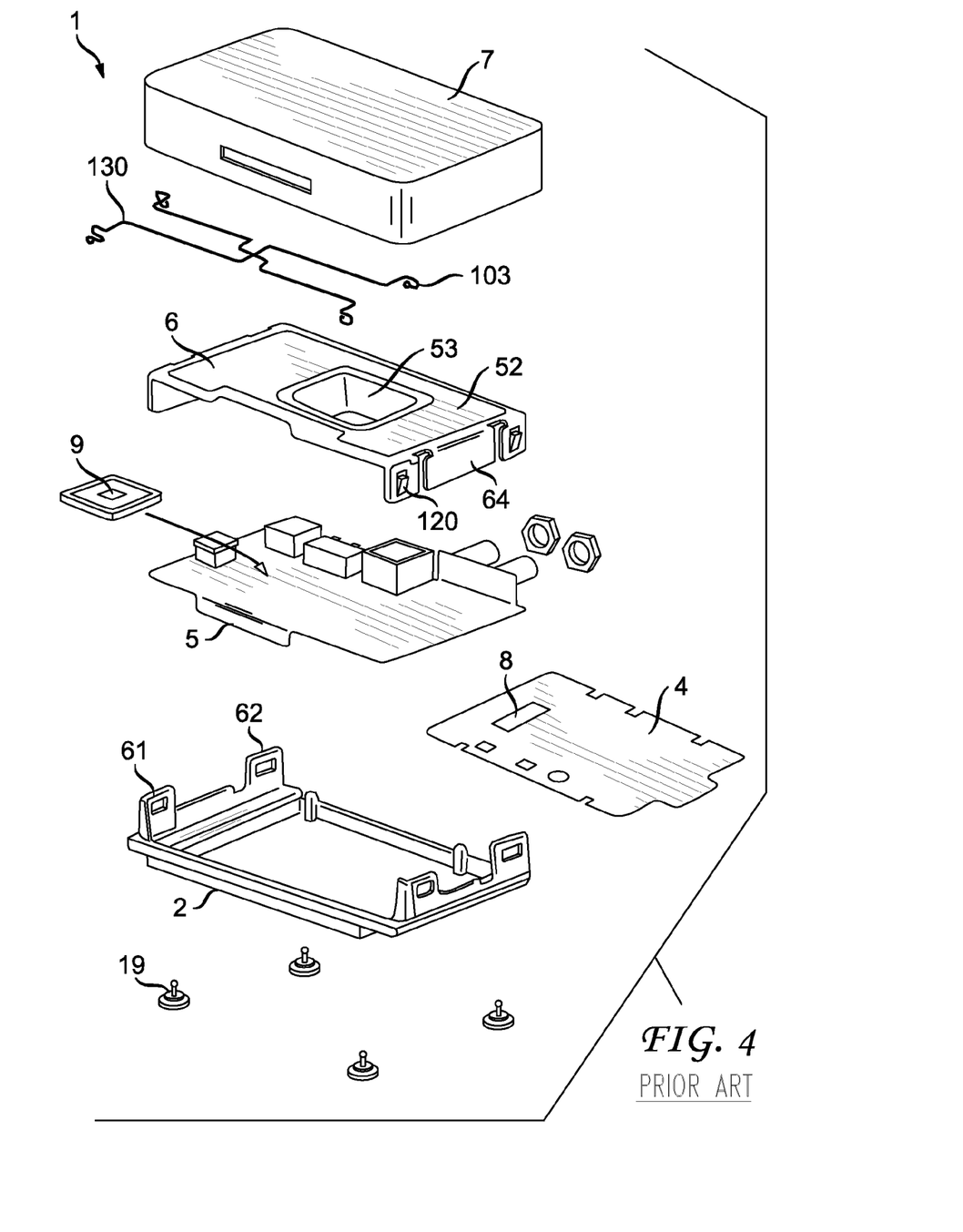
FIG. 4 is an exploded view of the set top box with a known hold down.

The set top box 1 described in FIGS. 1-3 further includes a hold down 130 to secure the heat sink 6 against the circuit board 5. FIG. 4 shows an exploded view of the set top box 1 with the hold down 130. The hold down 130 includes a frame that defines a perimeter. The hold down 130 may be a rectangular frame that generally matches the shape of the heat sink 6. The perimeter of the hold down 130 includes retainers 103 arranged at the ends of the hold down 130. The retainers 103 are shaped to match and engage mating locations provided on at least the bottom frame 2. The heat sink 6 may also include mating locations for the retainers 103. The hold down 130 is preferably constructed from a rigid flexible material, such as a wire or multiple wires, preferably stainless steel, that may extend diagonally to bias the heat sink 6 downwards against the thermal pad 9 and to provide contact between the circuit board 5, the thermal pad 9, and the central depression 53 of the heat sink 6 for proper thermal dissipation. The wires may cross each other such that one wire includes a bent portion that extends below the other wire. The region where the hold down components or wires cross can be centralized to be over the central depression and can be inside the central depression. The hold down or wires can be applied to the prior art assemblies to enhance heat transfer to the heat sink.

The bottom surface of the central depression 53 and the circuit board 5 contact the thermal pad 9 on opposite sides and sandwich the thermal pad 9 between them. The hold down 130 improves the surface contact among these components.

The hold down 130 may be formed from a resilient material. The hold down 130 is preferably dimensioned such that the hold down 130 is tensioned when installed and exerts a biasing force across the top of the heat sink 6 or at a specific location on the heat sink 6 after the retainers 103 of the hold down 130 engage the mating locations of the bottom frame 2 and the heat sink 6.

Figure 9:
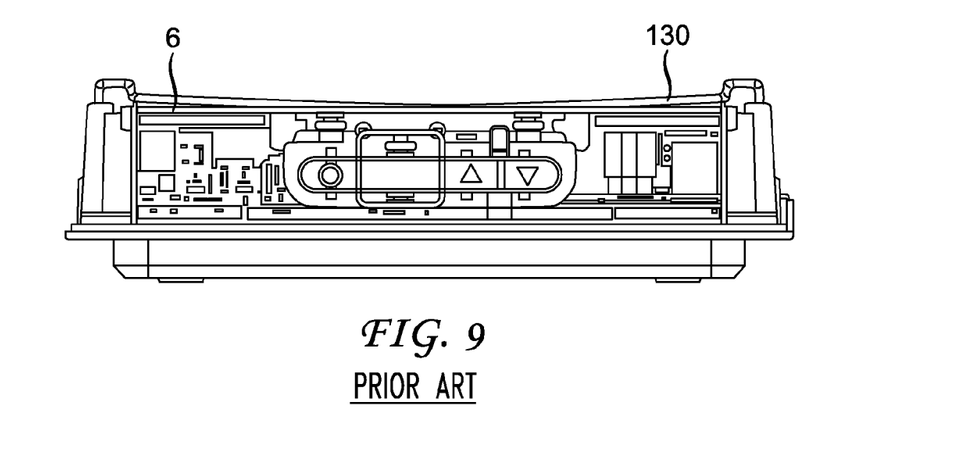
FIG. 9 illustrates the known hold down including a bow in the downward direction.

The top surface of the heat sink 6 may define a longitudinal plane and the frame of the hold down 130 may extend in this plane or in a parallel plane. As shown in FIG. 9, when the hold down 130 engages the mating locations of the bottom frame 2 and the heat sink 6 and the hold down 130 engages the top surface of the heat sink 6, the heat sink 6 and the hold down 130 bows in the downward direction away from the initial plane or planes. The hold down 130 may also include end portions that rise vertically above the longitudinal plane of the heat sink 6. The extent of the hold down 130 between the end portions may bow downwardly to apply force to the heat sink 6. The hold down 130 may include a central portion that extends downward into the central depression 53 of the heat sink 6 and along the inner contours of the central depression 53 such that the hold down 130 is in further contact with the heat sink 6 and movement is further reduced. As compared to existing set top boxes, the hold down 130 allows for a thinner thermal pad 9 to be used because of the biasing force from the hold down 130 on the heat sink 6.

Figure 5:
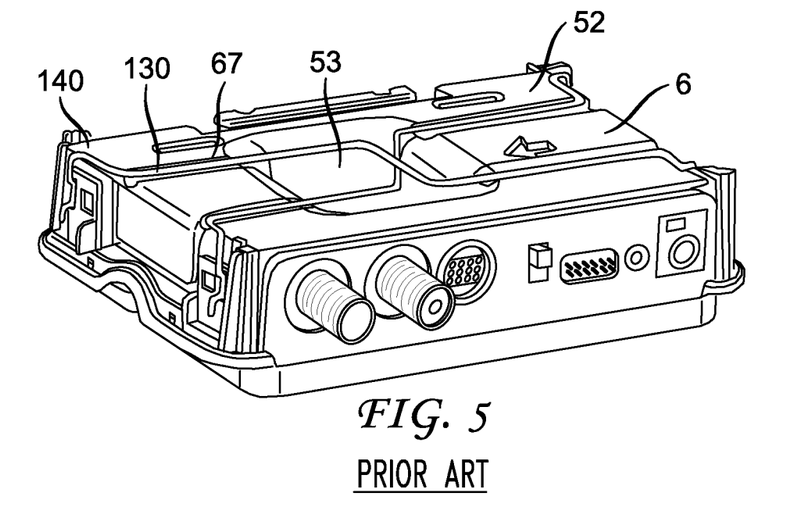
FIG. 5 illustrates grooves in the heat sink for engaging the known hold down.

FIGS. 5-8 show various features of the set top box 1 and the hold down 130. The retainers 103 of the hold down 130 engage slots 92 formed on the vertically extending portions 62 of the bottom frame 2 and slots 120 formed on the vertical extensions 64 of the heat sink 6. FIG. 5 shows an assembled cutaway view of the set 5 top box 1 with the hold down 130 pressing the central depression 53 of the heat sink 6 downward onto the thermal pad 9 on the circuit board 5. The heat sink 6 may include grooves 67 that are sufficiently deep to receive the hold down 130 and prevent the hold down 130 from protruding above the heat sink 6. The grooves 67 allow the vertical height of the set top box 1 to remain the same as compared to set top boxes without a hold down. The vertical extensions 64 of the heat sink 6 may also include cut out portions 140 that are shaped to receive retainer portions 103 of the hold down 130.

Figure 6:
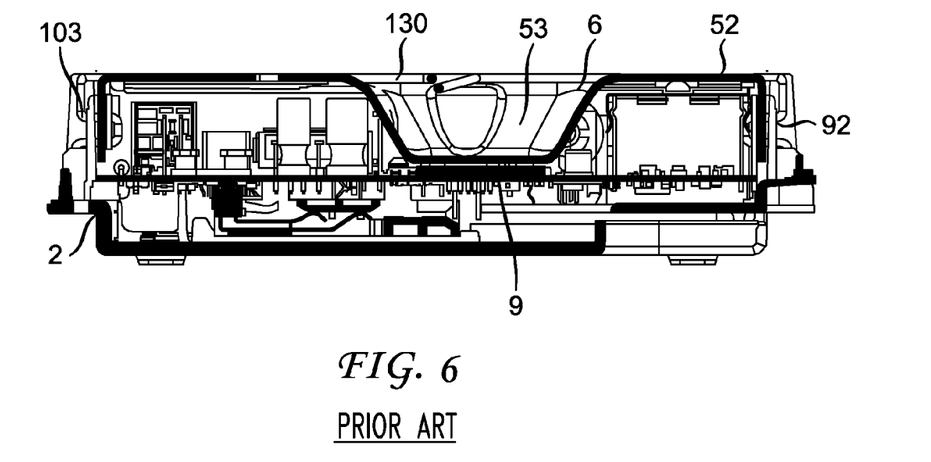
FIG. 6 illustrates how the known hold down engages the top surface of the heat sink and the mating locations of the bottom frame.
Figure 7:
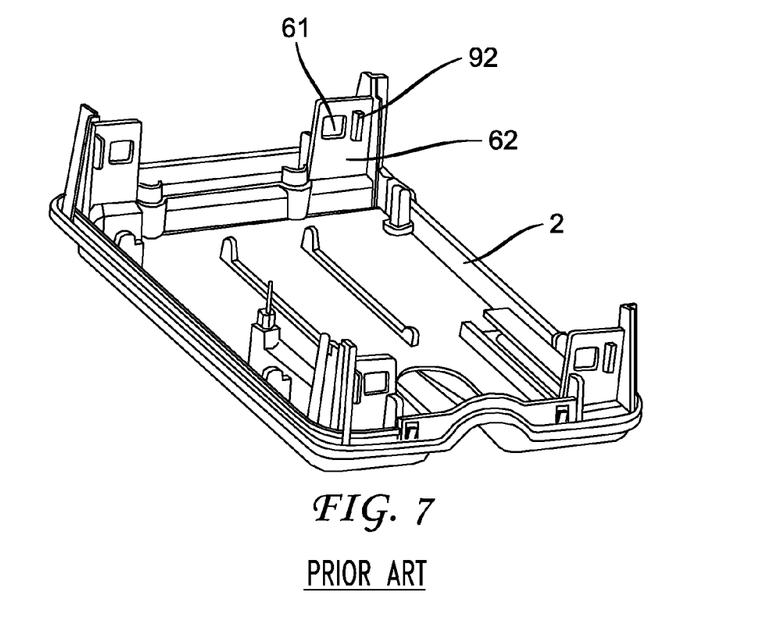
FIG. 7 illustrates the slots on the bottom cover.
Figure 8:
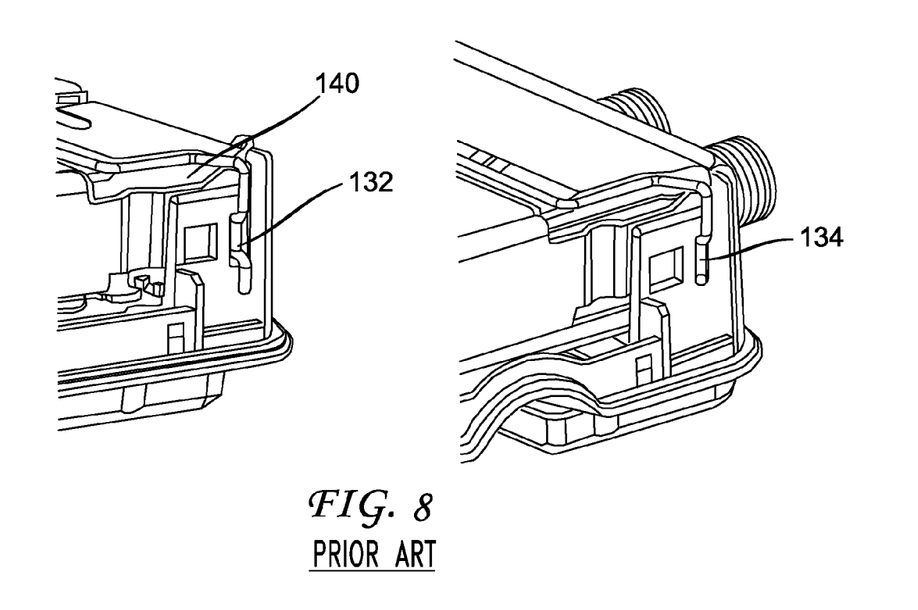
FIG. 8 illustrates alternative retainers of the known hold down.

FIG. 6 is sectional side view of the set top box 1 and illustrates the improved contact of the bottom surface of the central depression 53 with the thermal pad 9 as compared to existing set top boxes. FIG. 7 illustrates the slots 61 on the bottom frame 2 for receiving the clips 71 of the heat sink 6, and the slots 92 for receiving the retainers 103 at the ends of the hold down 130. FIG. 8 shows alternative embodiments of the retainers 103 of the hold down 130 and illustrates the retainers 103 may include any suitable end which secures the hold down 130 with the mating locations of the bottom frame 2 and the heat sink 6. The retainers 103 may include ends 132 with U-shaped or V-shaped inward contours that engage the slots 92 of the bottom frame 2 and the slots 120 of the heat sink 6. The retainers 103 may alternatively include ends 134 with a first vertical portion, a lower horizontal portion, and second vertical portion which engage the slots 92, 120 of the bottom frame 2 and heat sink 6. As noted above, the ends 132, 134 may engage the slots 92, 120 in such a way to tension the hold down 130.

SUMMARY OF THE INVENTION

A series of springs for an electronic device is provided that urges a heat sink against a circuit board. The heat sink snaps into a bottom frame. The springs contact the interior side of a top cover and top surface of the heat sink. The heat sink contacts upper side of the circuit board or components thereon and is positioned between the bottom frame 2 and the top cover 7. The springs provide a biasing force that urges the heat sink against the circuit board.

Embodiments of the invention provide springs for a set top box or the like that includes a bottom frame, a circuit board mounted above the bottom frame, a thermal pad mounted on the circuit board, and a heat sink associated with the thermal pad. The springs can each be made of a flat elongated strip of metal and have a V-shape. The springs can be rotated, such that the axis of symmetry of the V-shape of the springs runs parallel to the portion of the heat sink that the springs contact. The plurality of springs are used to engage with a plurality of mating locations on the interior side of the top cover and provide a biasing force that retains the heat sink against a circuit board that is positioned between the bottom frame and the springs. The heat sink can include a planar portion surrounding a central depression portion and/or another depression portion. The springs secure the thermal pad of the circuit board between the central depression portion and/or other portion of the heat sink and the circuit board. The plurality of wires can be dimensioned such that the biasing force is the necessary force needed to ensure sufficient thermal contact between the thermal pad on the circuit board and the central depression of the heat sink and to ensure no rattling the heat sink.

The heat sink can include grooves for receiving ends of the springs. The heat sink can include a second central depression portion that contacts a second heat generating component on the circuit board. The bottom frame can include vertically extending portions on opposing sides having slots and the heat sink can include vertical extensions having clips that snap into the slots of the bottom frame, thereby securing the heat sink to the bottom frame. The retainers can include U-shaped or V-shaped contours that are received in the mating locations of the bottom frame and the heat sink. The retainers can include a first vertical portion, a lower horizontal portion, and second vertical portion that is received in the mating locations of the bottom frame and the heat sink.

Embodiments of the invention are directed to an electronic device comprising: a bottom frame, a circuit board mounted above the bottom frame, a thermal pad mounted on the circuit board, a heat sink associated with the thermal pad, and V-shaped springs for providing a biasing force that retains the heat sink against the thermal pad. The hold down can comprise a frame that defines a perimeter having a plurality of retainers that are configured to engage with a plurality of mating locations defined on at least the bottom frame. The heat sink can include a planar portion surrounding a central depression portion and the hold down secures the thermal pad of the circuit board between the central depression portion of the heat sink and the circuit board. The hold down includes a plurality of wires that cross each other. The springs can be dimensioned such that the biasing force is applied across a top surface of the heat sink. The heat sink includes grooves in the planar portion for receiving the springs.

Described herein is an electronic device, including a top frame, a bottom frame, a circuit board mounted above the bottom frame, a thermal pad mounted on the circuit board, a heat sink associated with the thermal pad and a plurality of springs for providing a biasing force that retains the heat sink against the thermal pad, the heat sink including a planar portion surrounding a central depression, wherein the plurality of springs secure the thermal pad of the circuit board between the central depression portion of the heat sink and the circuit board.

BRIEF DESCRIPTION OF THE DRAWINGS

The present invention is best understood from the following detailed description when read in conjunction with the accompanying drawings. The drawings include the following figures briefly described below.

DETAILED DESCRIPTION OF THE PREFERRED EMBODIMENTS

The advantage of the present invention is that it eliminates the need for hold downs 130 or can be used for extra stability, the possible need for long grooves 67 in the heat sink to accommodate hold downs 130, and the need for the retainers 103 which secures the hold down 130 with the mating locations of the bottom frame 2 and the heat sink 6.

Figure 10:
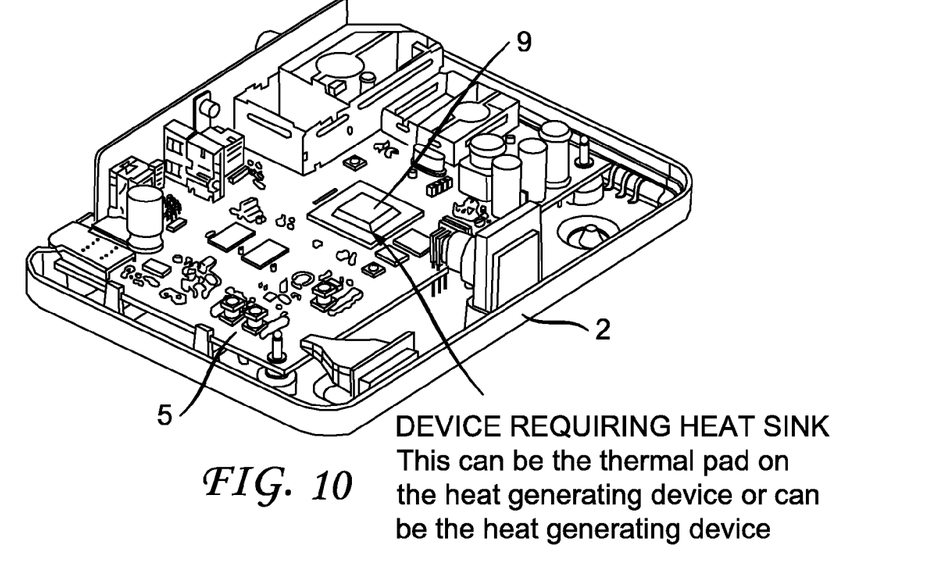
FIG. 10 shows a perspective view of a printed circuit board having a thermal contact pad in a bottom frame of a set top box.

The invention can be understood with reference to FIGS. 10-13. The invention is applicable to set top boxes and like that have a printed circuit board 5 having a central heat generating component and/or a thermal contact pad 9 thereon in a bottom frame 2 of a set top box as shown in FIG. 10.

Figure 11:
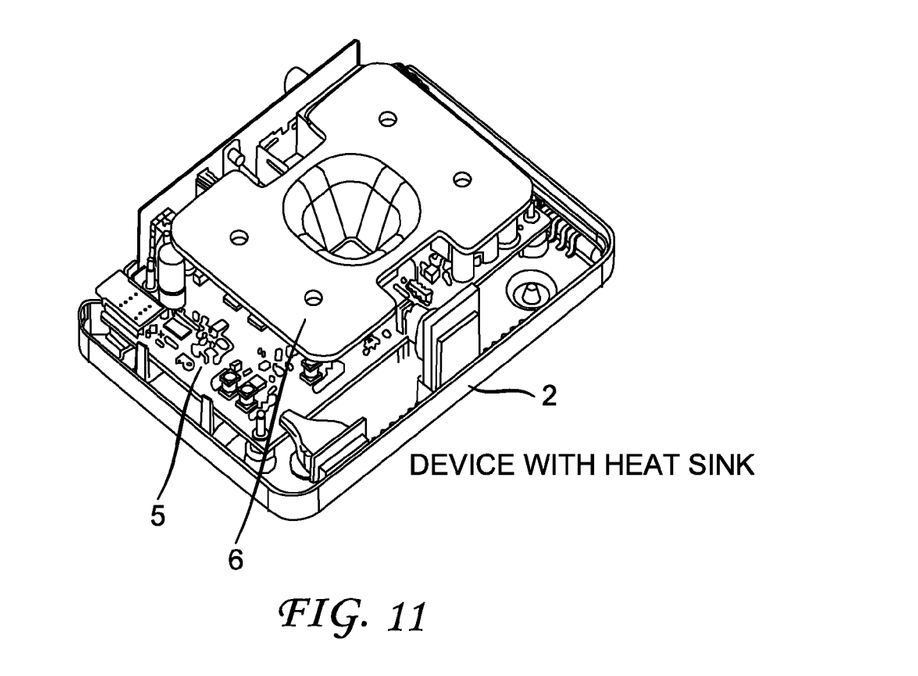
FIG. 11 shows a perspective view of a heat sink on the printed circuit board that needs to contact the thermal contact pad in a bottom frame of a set top box, wherein the heat can have no vertical extensions 64 and receive clips 71 as shown in FIG. 2.

FIG. 11 shows a perspective view of heat sink 6 overlaid on the printed circuit board 5 that is designed to contact the heat generating component or thermal contact pad 9 in a bottom frame 2.

Figure 12A:
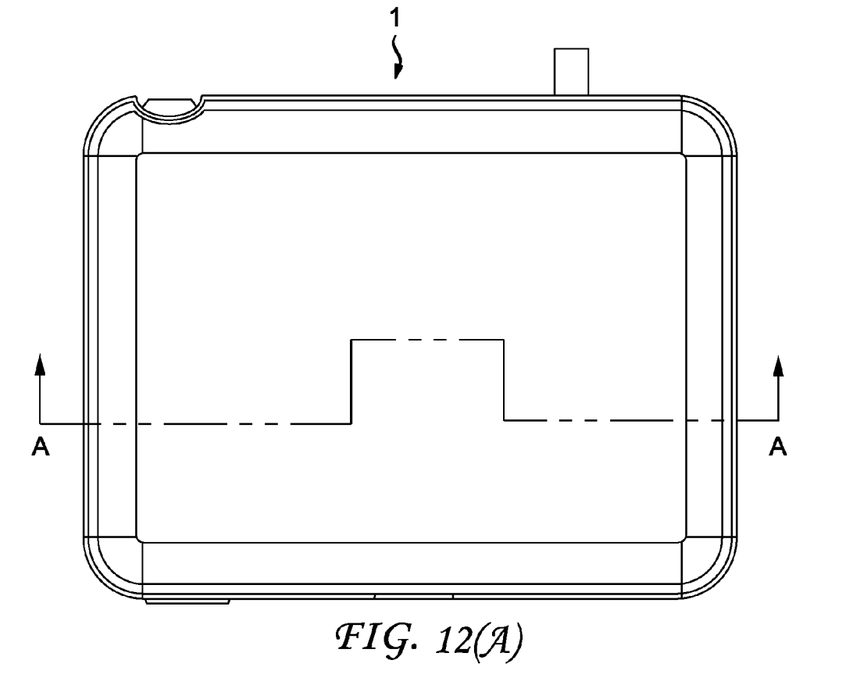
FIG. 12 shows various views of the set top box according to the he invention to illustrate where the springs are utilized in which there are 4 springs each in a quadrant.
Figure 12B:
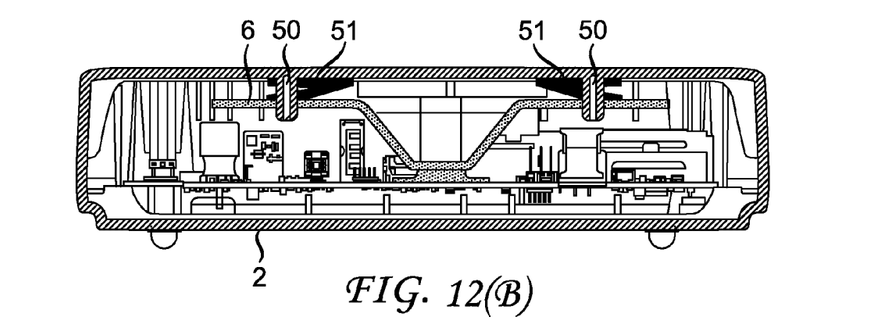
Figure 12C:
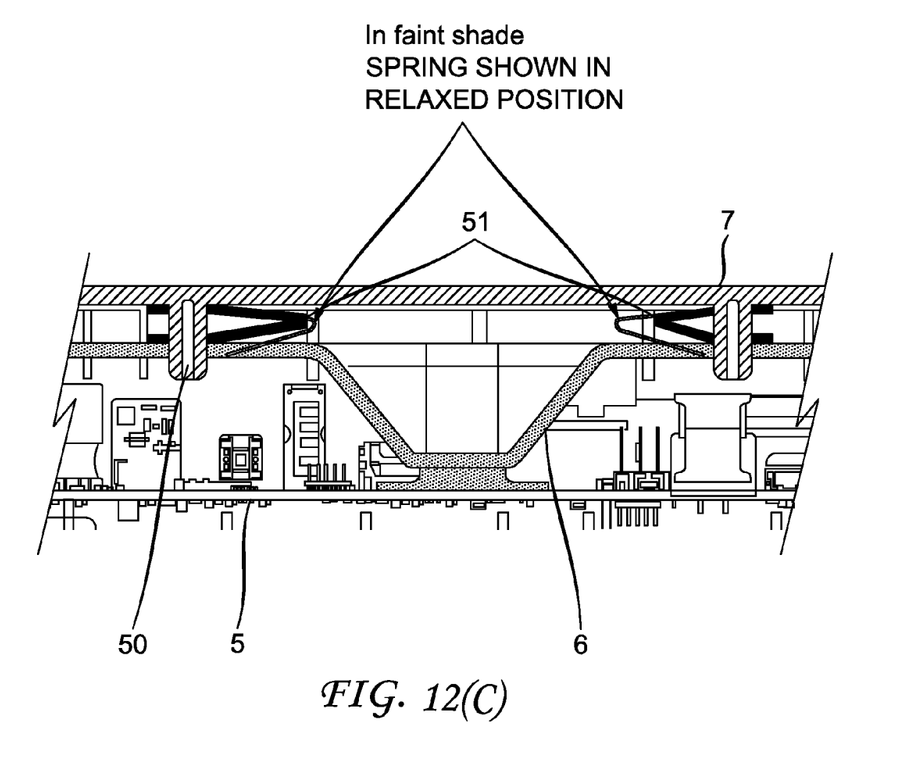

FIG. 12(A) shows a plan top view of the set top box 1 according to the invention and further shows cut A-A of the set top box for interior sectional view of the set top box in FIGS. 12(B) and 12(C). FIG. 12(C) is a more magnified view of FIG. 12(B) and better shows the springs 51. FIGS. 12(B) and 12(C) show that the springs 51 are generally V-shaped and have apertures 54 (shown on FIG. 13) that engage the vertically extending posts 50 which protrude from the interior surface of the top 7, which can be cylindrical. Each post 50 at its bases can have a bent mesa or inwardly facing U-shaped structure 56 (shown on FIG. 13) partially surrounding it that can have three sides that are designed to surround one end and two sides of the spring which contacts top 7 when the spring is placed on the post 50. The structure 56 can be designed to securely and tightly hold the spring on the post to prevent the springs from falling off during final assembly when the top is placed on the base.

Figure 13:
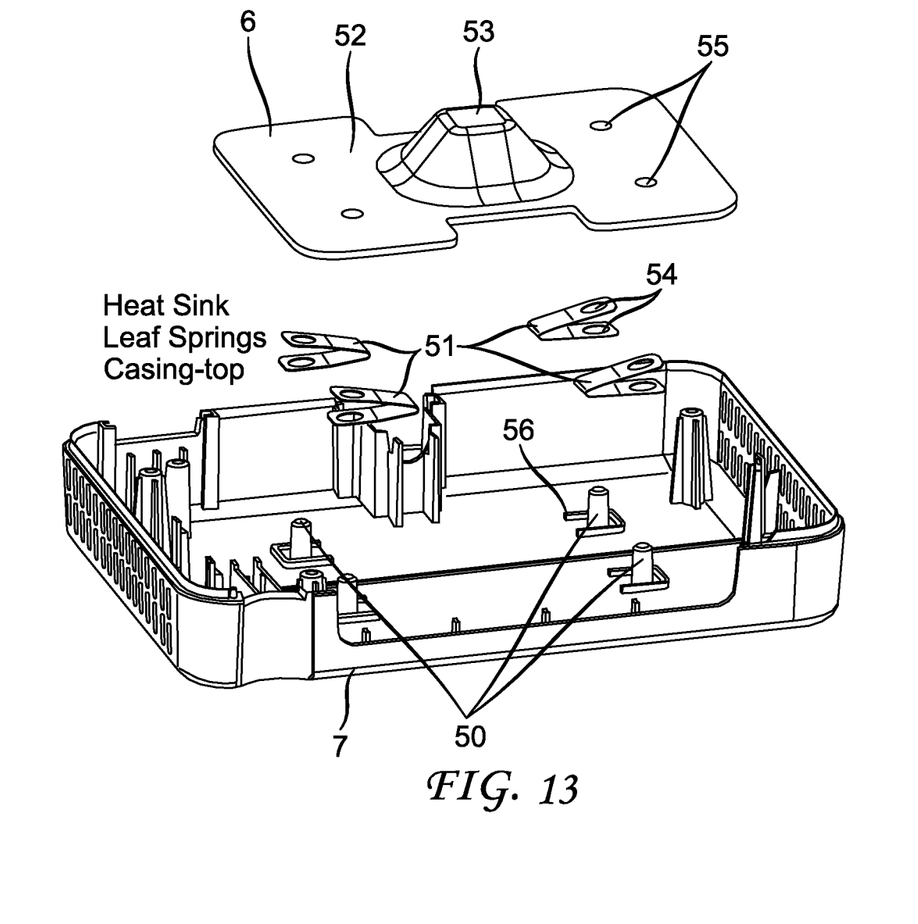
FIG. 13 shows a disassembled view of the set top box to further illustrate the positioning of the springs.

FIG. 13 shows a disassembled view of the set top box to further illustrate the positioning of the springs 51. The top of the set top box is shown upside down to better illustrate the present invention and it operation. This view shows the apertures 54 of the springs and matching heat sink apertures 55 on the peripheral portion 52 of the heat sink 6. In a fully assembled state each post 50 is positioned in both corresponding apertures 54 of the springs (i.e. in the top half and bottom half) and the corresponding heat sink apertures 55 and the top half of the spring 51 at it end is surrounded and secured by the bent mesa or inwardly facing U-shaped structure 56.

The series of springs 51 urges the heat sink 6 against a circuit board 5. The heat sink can be snapped into the bottom frame and the spring can provide additional urging. The springs contact the interior side of a top cover and top surface of the heat sink. The heat sink contacts upper side of the circuit board or components thereon and is positioned between the bottom frame 2 and the top cover 7. The springs can provide a biasing force that urges the heat sink against the circuit board even when the heat sink is not snapped into the bottom frame as shown in FIG. 2.

Embodiments of the invention provide springs for a set top box or the like that includes a bottom frame, a circuit board mounted above the bottom frame, a thermal pad mounted on the circuit board, and a heat sink associated with the thermal pad. The springs can each be made of a flat elongated strip metal and have a V-shape. The springs can be rotated, such that the axis of symmetry of the V-shape runs parallel to the portion of the heat sink that the springs contact. The plurality of springs are to engage with a plurality of mating locations established by the posts and mesas (50, 56) on the interior side of the top cover and provide a biasing force that retains the heat sink against a circuit board that is positioned between the bottom frame and the springs when the posts 50 engage the apertures 54 of the springs and the apertures 55 of the heat sink. The heat sink can include a planar portion 52 surrounding a central depression portion 53 and/or another depression portion. The springs secure the thermal pad of the circuit board between the central depression portion and/or other portions of the heat sink and the circuit board. The plurality of springs can be dimensioned such that the biasing force is the necessary force needed to ensure sufficient thermal contact between the thermal pad on the circuit board and the central depression of the heat sink and to ensure no rattling the heat sink.

The heat sink can include a second central depression portion that contacts a second heat generating component on the circuit board. The top frame can include vertically extending portions on opposing sides having slots and the heat sink can include vertical extensions having clips that snap into the slots of the top frame, thereby securing the heat sink to the bottom frame. The retainers can include U-shaped or V-shaped contours that are received in the mating locations of the top frame and the heat sink. The retainers can include a first vertical portion, a lower horizontal portion, and second vertical portion that is received in the mating locations of the bottom frame and the heat sink. As such, features shown in the FIGS. 1-9 can be included in combination with the springs 51 to be additional embodiments of the invention.

Further advantages of the invention are the springs provide an uncomplicated means of providing even pressure on the thermal pad without the need to take up any of the current circuit board's space and without the need to put additional pins, screws or holes in the circuit boards.

The foregoing illustrates only some of the possibilities for practicing the invention. Many other embodiments are possible within the scope and spirit of the invention. It is, therefore, intended that the foregoing description be regarded as illustrative rather than limiting.

In summary, what is disclosed is an electronic device including: a bottom frame, a circuit board mounted above the bottom frame, a thermal pad mounted on the circuit board, a heat sink associated with the thermal pad, and a springs for providing a biasing force that retains the heat sink against the thermal pad. The heat sink can include a planar portion surrounding a central depression portion and the springs secure the thermal pad of the circuit board between the central depression portion of the heat sink and the circuit board. The plurality of springs is dimensioned such that the biasing force is applied across a top surface of the heat sink.

Given the teachings herein, one of ordinary skill in the related art will be able to contemplate these and similar implementations or configurations of the present invention.

The invention claimed is:

1. An electronic device, comprising:
a top frame;
a bottom frame;
a circuit board mounted above said bottom frame;
a thermal pad mounted on said circuit board;
a heat sink associated with said thermal pad; and
a plurality of springs for providing a biasing force that retains said heat sink against said thermal pad, said heat sink including a planar portion surrounding a central depression, wherein the plurality of springs secure said thermal pad of said circuit board between said central depression portion of said heat sink and said circuit board, wherein said springs are each made of an elongated strip of metal bent such that a V-shape is formed, wherein said plurality of springs have an aperture therein to engage vertical posts protruding from said top frame of said device, wherein said top frame of said device also includes a plurality of bent mesa or inwardly facing U-shaped structures having three sides to surround one end and two sides of each of said springs when said springs are placed on said vertical posts.

2. The device of claim 1, wherein said springs can be rotated such that an axis of symmetry of the V-shape runs parallel to a portion of the heat sink that said springs contact.

3. The device of claim 1, wherein the plurality of springs are dimensioned such that the biasing force is force needed to ensure sufficient contact between said thermal pad of said circuit board and said central depression of said heat sink.

4. The device of claim 1, wherein said heat sink includes a second central depression in contact with a second heat generating portion of said circuit board, said top frame including vertical posts on opposing sides having slots, said heat sink including said vertical posts having clips that snap into said slots of said top frame, thereby securing said heat sink to said top frame.

5. The device of claim 4, wherein heat sink retainers include U-shaped or V-shaped contours that are received in mating locations of said top frame and said heat sink.

* * * * *